United States Patent
Klaba

(10) Patent No.: US 11,281,267 B2
(45) Date of Patent: Mar. 22, 2022

(54) METHODS AND SYSTEMS FOR IDENTIFYING A CONNECTION PATH BETWEEN A POWER SOURCE AND A LOAD

(71) Applicant: OVH, Roubaix (FR)

(72) Inventor: Miroslaw Piotr Klaba, Roubaix (FR)

(73) Assignee: OVH, Roubaix (FR)

( * ) Notice: Subject to any disclaimer, the term of this patent is extended or adjusted under 35 U.S.C. 154(b) by 158 days.

(21) Appl. No.: 16/396,854

(22) Filed: Apr. 29, 2019

(65) Prior Publication Data

US 2019/0377394 A1    Dec. 12, 2019

(30) Foreign Application Priority Data

Jun. 8, 2018   (EP) .................... 18315010

(51) Int. Cl.
*G06F 1/26* (2006.01)
*H02J 9/06* (2006.01)
*H05K 7/14* (2006.01)

(52) U.S. Cl.
CPC .................. *G06F 1/26* (2013.01); *H02J 9/06* (2013.01); *H05K 7/1497* (2013.01)

(58) Field of Classification Search
CPC ..... G06F 1/32; G06F 1/12; G06F 1/26; G06F 9/44
See application file for complete search history.

(56) References Cited

U.S. PATENT DOCUMENTS

| | | |
|---|---|---|
| 1,041,381 A | 8/1977 | Hwa |
| 5,319,571 A | 6/1994 | Langer et al. |
| 6,400,802 B1 | 6/2002 | Legare |
| 6,417,672 B1 | 7/2002 | Chong |
| 6,574,576 B2 | 6/2003 | Chen et al. |

(Continued)

FOREIGN PATENT DOCUMENTS

| | | |
|---|---|---|
| CN | 1725707 A | 1/2006 |
| CN | 1917433 A | 2/2007 |

(Continued)

OTHER PUBLICATIONS

English Abstract for EP3065250 retrieved on Espacenet on Dec. 23, 2020.

(Continued)

*Primary Examiner* — Keshab R Pandey
(74) *Attorney, Agent, or Firm* — BCF LLP

(57) ABSTRACT

Methods and systems identify connection paths between a power source and a plurality of loads. A reachability signal is sent on a cable connecting a power output of the power source to a power distribution unit (PDU). The PDU receives the reachability and forwards a modified reachability signal on one or more power outputs of the PDU to one or more loads. The PDU receives a return reachability signal from the one or more loads and forwards corresponding modified return reachability signals on the cable to the power source. The power output of the power source receives a plurality of modified return reachability signals that each comprises an identity of the PDU, an identity of a respective power output of the PDU, and an identity of a respective load. A reference between these identities is stored by the power source in a database.

18 Claims, 6 Drawing Sheets

(56) References Cited

U.S. PATENT DOCUMENTS

| | | |
|---|---|---|
| 6,690,177 B2 | 2/2004 | Dalebroux |
| 6,917,888 B2 | 7/2005 | Logvinov et al. |
| 7,030,734 B2 * | 4/2006 | Butler ............... H04B 3/542 |
| | | 340/3.43 |
| 7,030,771 B2 | 4/2006 | Kinnard et al. |
| 7,031,859 B2 | 4/2006 | Piesinger |
| 7,034,663 B2 | 4/2006 | Mansfield et al. |
| 7,203,849 B2 | 4/2007 | Dove |
| 7,254,511 B2 | 8/2007 | Niedzwiecki et al. |
| 7,269,753 B2 * | 9/2007 | Farkas ............... H02J 13/0006 |
| | | 713/330 |
| 7,308,591 B2 | 12/2007 | Dubinsky |
| 7,532,011 B2 | 5/2009 | Shi |
| 7,646,225 B2 | 1/2010 | Song et al. |
| 7,701,325 B2 | 4/2010 | White |
| 7,870,374 B2 | 1/2011 | Cagno et al. |
| 7,877,622 B2 | 1/2011 | Gruendler |
| 8,010,336 B2 | 8/2011 | Chaiquin |
| 8,077,049 B2 | 12/2011 | Yaney et al. |
| 8,165,723 B2 | 4/2012 | Nasle |
| 8,188,855 B2 | 5/2012 | Sharma |
| 8,239,073 B2 | 8/2012 | Fausak et al. |
| 8,305,737 B2 | 11/2012 | Ewing et al. |
| 8,359,177 B2 | 1/2013 | Lelong et al. |
| 8,494,661 B2 | 7/2013 | Ewing et al. |
| 8,494,686 B2 | 7/2013 | Masters et al. |
| 8,497,779 B1 | 7/2013 | Waide |
| 8,564,920 B1 | 10/2013 | Smith et al. |
| 8,635,484 B2 | 1/2014 | Turicchi et al. |
| 8,639,459 B1 | 1/2014 | Morales et al. |
| 8,726,045 B2 | 5/2014 | Goodrum et al. |
| 8,729,905 B2 | 5/2014 | McCormack et al. |
| 8,732,508 B2 | 5/2014 | Cochran et al. |
| 8,914,250 B2 | 12/2014 | Dzung et al. |
| 9,122,466 B1 | 9/2015 | Kellett et al. |
| 9,143,197 B2 | 9/2015 | Vijayasankar et al. |
| 9,182,795 B1 | 11/2015 | Hill et al. |
| 9,210,257 B2 | 12/2015 | Hall et al. |
| 9,213,380 B2 | 12/2015 | Bandholz et al. |
| 9,608,440 B2 | 3/2017 | Familiant et al. |
| 9,835,662 B2 | 12/2017 | Driscoll et al. |
| 9,841,449 B2 | 12/2017 | Mikulka et al. |
| 9,871,406 B1 | 1/2018 | Churnock et al. |
| 9,965,013 B1 | 5/2018 | McGee et al. |
| 10,459,016 B2 | 10/2019 | Driscoll et al. |
| 10,571,493 B2 | 2/2020 | Sonderegger |
| 10,831,251 B1 | 11/2020 | Ross |
| 2003/0084112 A1 | 5/2003 | Curray et al. |
| 2006/0085346 A1 | 4/2006 | Riley |
| 2007/0002506 A1 | 1/2007 | Papallo et al. |
| 2007/0054622 A1 | 3/2007 | Berkman |
| 2007/0135086 A1 | 6/2007 | Stanford |
| 2007/0162620 A1 | 7/2007 | Terry et al. |
| 2007/0189302 A1 | 8/2007 | Lee et al. |
| 2007/0191992 A1 | 8/2007 | Taliaferro |
| 2007/0205664 A1 * | 9/2007 | Kawakubo ............... G06F 1/30 |
| | | 307/23 |
| 2008/0221737 A1 | 9/2008 | Josephson et al. |
| 2008/0303353 A1 | 12/2008 | Yu et al. |
| 2009/0089594 A1 | 4/2009 | Cagno et al. |
| 2009/0189774 A1 | 7/2009 | Brundridge et al. |
| 2009/0207753 A1 | 8/2009 | Bieganski |
| 2009/0210178 A1 | 8/2009 | Bieganski |
| 2009/0217073 A1 * | 8/2009 | Brech ............... G06F 11/30 |
| | | 713/340 |
| 2009/0282274 A1 | 11/2009 | Langgood et al. |
| 2009/0287943 A1 | 11/2009 | Brey et al. |
| 2009/0287949 A1 | 11/2009 | Bradicich et al. |
| 2010/0204850 A1 | 8/2010 | Hendrieckx |
| 2011/0047188 A1 * | 2/2011 | Martins ............... H04L 12/10 |
| | | 707/803 |
| 2011/0116387 A1 | 5/2011 | Beeco et al. |
| 2011/0167282 A1 | 7/2011 | Brown et al. |
| 2011/0218689 A1 | 9/2011 | Chan et al. |
| 2011/0320827 A1 * | 12/2011 | Siegman ............... H02J 13/0005 |
| | | 713/300 |
| 2012/0117392 A1 | 5/2012 | Turicchi et al. |
| 2012/0189042 A1 | 7/2012 | Varadarajan et al. |
| 2012/0223840 A1 | 9/2012 | Guymon et al. |
| 2012/0239958 A1 | 9/2012 | Archibald et al. |
| 2012/0330472 A1 | 12/2012 | Boot |
| 2013/0002409 A1 | 1/2013 | Molina et al. |
| 2013/0020868 A1 | 1/2013 | Wu et al. |
| 2013/0073882 A1 | 3/2013 | Inbaraj et al. |
| 2013/0123998 A1 | 5/2013 | King et al. |
| 2013/0241284 A1 | 9/2013 | Santini et al. |
| 2013/0253861 A1 | 9/2013 | Nicholson et al. |
| 2014/0115353 A1 | 4/2014 | Hutten et al. |
| 2014/0143578 A1 | 5/2014 | Cenizal et al. |
| 2014/0164812 A1 | 6/2014 | Alshinnawi et al. |
| 2014/0164814 A1 | 6/2014 | Henise et al. |
| 2014/0177736 A1 * | 6/2014 | Alshinnawi ............... H02J 13/00017 |
| | | 375/257 |
| 2014/0181564 A1 | 6/2014 | Alshinnawi et al. |
| 2014/0355610 A1 | 12/2014 | Ge et al. |
| 2015/0074431 A1 | 3/2015 | Nguyen |
| 2015/0177814 A1 | 6/2015 | Bailey et al. |
| 2016/0195911 A1 | 7/2016 | Chapel et al. |
| 2016/0337512 A1 | 11/2016 | Kalavai |
| 2016/0378631 A1 | 12/2016 | Calio et al. |
| 2017/0149243 A1 | 5/2017 | Dozier et al. |
| 2017/0327242 A1 | 11/2017 | Lopez et al. |
| 2018/0052431 A1 | 2/2018 | Shaikh et al. |
| 2018/0074561 A1 | 3/2018 | Wang et al. |
| 2018/0131163 A1 | 5/2018 | Jen et al. |
| 2018/0337554 A1 | 11/2018 | Thomas et al. |
| 2019/0123580 A1 | 4/2019 | Bindea et al. |
| 2019/0243977 A1 | 8/2019 | Pfleger et al. |
| 2019/0377394 A1 | 12/2019 | Klaba |
| 2020/0021106 A1 | 1/2020 | Thibaut et al. |
| 2020/0042068 A1 | 2/2020 | Rong et al. |
| 2020/0142465 A1 | 5/2020 | Jenne et al. |
| 2020/0293101 A1 | 9/2020 | Krueger et al. |
| 2020/0295591 A1 | 9/2020 | Mohan et al. |
| 2021/0013735 A1 | 1/2021 | Pachoud et al. |

FOREIGN PATENT DOCUMENTS

| | | |
|---|---|---|
| CN | 101983494 B | 8/2014 |
| CN | 110601723 A | 12/2019 |
| DE | 10112844 A1 | 9/2002 |
| EP | 0724799 A1 | 8/1996 |
| EP | 2158726 A2 | 3/2010 |
| EP | 2260611 B1 | 8/2014 |
| EP | 2863723 A2 | 4/2015 |
| EP | 2572165 B1 | 11/2017 |
| EP | 3272071 A1 | 1/2018 |
| EP | 3065250 B1 | 11/2018 |
| EP | 3595120 A1 | 1/2020 |
| FR | 3033969 B1 | 3/2017 |
| KR | 200435020 Y1 | 1/2007 |
| KR | 100849920 B1 | 8/2008 |
| WO | WO9501030 A1 | 1/1995 |
| WO | 03073177 A1 | 9/2003 |
| WO | 2006037605 A1 | 4/2006 |
| WO | 2008157668 A3 | 1/2009 |
| WO | 2009105169 A2 | 8/2009 |
| WO | 2009123586 A1 | 10/2009 |
| WO | 2010/151835 A2 | 12/2010 |
| WO | 2013111760 A1 | 8/2013 |
| WO | 2016151217 A1 | 9/2016 |
| WO | 2017158608 A1 | 9/2017 |
| WO | 2019172519 A1 | 9/2019 |

OTHER PUBLICATIONS

English Abstract for CN110601723 retrieved on Espacenet on Dec. 23, 2020.
English Abstract for CN101983494 retrieved on Espacenet on Dec. 23, 2020.
English Abstract for CN 1917433 retrieved on Espacenet on Dec. 23, 2020.

(56) References Cited

OTHER PUBLICATIONS

English Abstract for CN 1725707 retrieved on Espacenet on Dec. 23, 2020.

English Description and Claims for KR200435020 retrieved on Espacenet on Dec. 23, 2020.

Galli et al., "For the Grid and Through the Grid: The Role of Power Line Communications in the Smart Grid", The Proceedings of the IEEE, 2011, pp. 1-26.

Peng et al., "AMI Based Sensing Architecture for Smart Grid in IPV6 Networks", International Journal on Smart Sensing and Intelligent Systems 9.4: 2111(20). Exeley Inc. (Dec. 2016), pp. 1-8.

Luka et al., "Power Line Communications: A Platform for Sustainable Development", Research Gate, 3rd International Conference of African Development Issues, 2016, pp. 46-51.

Zhang et al., "Hybrid Communication Architectures for Distributed Smart Grid Applications", Energies, MDPI, 2018, vol. 11, pp. 1-16.

Rinaldi et al., "Performance analysis of power line communication in industrial power distribution network", Computer Standards & Interfaces, 2015, vol. 42, pp. 9-16.

Mlynek et al., "Simulation of Achievable Data Rates of Broadband Power Line Communication for Smart Metering", Applied Sciences, MDPI, 2019, vol. 9, pp. 1-22.

European Search Report with regard to the Patent Application No. 20315274.9 completed Oct. 19, 2020.

European Search Report with regard to the Patent Application No. 20315275.6 completed Oct. 23, 2020.

English Abstract for FR3033969 retrieved on Espacenet on Jan. 19, 2021.

Notice of Allowance with regard to the counterpart U.S. Appl. No. 17/308,820 dated Aug. 2, 2021.

European Search Report with regard to EP Patent Application EP 18315010 dated Aug. 7, 2018.

English Abstract of KR100849920 retrieved on Espacenet on Apr. 23, 2019.

English Abstract of DE10112844 retrieved on Espacenet on Apr. 23, 2019.

\* cited by examiner

METHODS AND SYSTEMS FOR IDENTIFYING A CONNECTION PATH BETWEEN A POWER SOURCE AND A LOAD

CROSS-REFERENCE

The present application claims priority to European Patent Application No. 18315010.1, filed on Jun. 8, 2018, the entirety of each of which is incorporated herein by reference.

FIELD

The present technology relates to systems and methods of electric power distribution. In particular, the systems and methods allow identifying a connection path between a power source and a load.

BACKGROUND

In today's data centers and processing centers, such as those used in blockchain technology, the numbers of computer servers become so large that they come to the verge of being unmanageable. In a data center, new servers may need to be added on a daily basis. Of course, some servers may fail and require maintenance or replacement.

All of these servers consume electric power provided by power sources, for example uninterruptible power sources (UPS), via cables.

Keeping track of power cabling in a data center having thousands of servers, perhaps tens of thousands of servers, becomes a daunting task. Considering that some servers may be assigned as redundant to other critical servers, it is very much desired to ensure that the failure of a power supply will not lead at once to the loss of a critical server and of its redundant server. To this end, it is important to be constantly aware of which server is connected to which power supply.

Given that servers are constantly added or changed in large data centers, conventional methods for identifying connections between servers and power supplies are inaccurate and slow while being too manpower intensive to be of practical use.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) lack of accuracy; (2) lack of speed; and/or (3) high manpower requirements.

In one aspect, various implementations of the present technology provide a method implemented in a power source for identifying connection paths between the power source and a plurality of loads, comprising:

sending, from a power output of the power source, on a cable connecting the power output of the power source to a power distribution unit (PDU), a reachability signal comprising an identity of the power source and an identity of the power output of the power source;

receiving, at the power output of the power source, on the cable, a plurality of return reachability signals, each received return reachability signal comprising the identity of the power source, the identity of the power output of the power source, an identity of the PDU, an identity of a respective power output of the PDU, and an identity of a respective load; and for each received return reachability signal, storing, in a database, a respective reference between the identity of the power source, the identity of the power output of the power source, the identity of the PDU, the identity of the respective power output of the PDU, and the identity of the respective load.

In some implementations of the present technology, each return reachability signal further comprises an identity of a power input of the respective load; and the method further comprises storing the identity of the power input of the respective load in the respective reference.

In some implementations of the present technology, each return reachability signal further comprises an identity of a power input of the PDU; and the reference stored in the database for each return reachability signal further comprises the identity of the power input of the PDU.

In some implementations of the present technology, the power output of the power source is one of a plurality of power outputs of the power source, the PDU is one of a plurality of PDUs, the cable is one of a plurality of cables, each one of the plurality of cables respectively connecting one of the plurality of power outputs of the power source to a respective one of the plurality of PDUs, the method further comprising: sending a reachability signal on each cable connecting a respective one of the plurality of power outputs of the power source to a respective one of the plurality of PDUs, each reachability signal comprising the identity of the power source and an identity of the respective one of the plurality of power outputs of the power source; receiving a plurality of additional return reachability signals, each return reachability signal: being received at a given one of the plurality of power outputs of the power source, and comprising the identity of the power source, the identity of the given one of the plurality of power outputs of the power source, an identity of a given one of the plurality of PDUs that is respective to the given one of the plurality of power outputs of the power source, an identity of a power output of the given one of the plurality of PDUs, and an identity of a given one of the plurality of loads; and for each of the plurality of additional return reachability signals, storing in the database a reference between: the identity of the power source, the identity of the given one of the plurality of power outputs of the power source, the identity of the given one of the plurality of PDUs, the identity of the power output of the given one of the plurality of PDUs, and the identity the given one of the plurality of loads.

In some implementations of the present technology, each return reachability signal further comprises an identity of a power input of the given one of the plurality of PDUs; and the reference stored in the database for each return reachability signal further comprises the identity of the power input of the given one of the plurality of PDUs.

In other aspects, various implementations of the present technology provide a method implemented in a power distribution unit (PDU) for identifying a connection path between a power source and a load, comprising:

receiving, at a power input of the PDU, on an input cable connecting the power input of the PDU to the power source, a reachability signal comprising an identity of the power source and an identity of a power output of the power source;

in response to receiving the reachability signal, forwarding, from a power output of the PDU, on an output cable connecting the power output of the PDU to the load, a modified reachability signal comprising the identity of the power source, the identity of the power output of the power source, an identity of the PDU, an identity of the power output of the PDU;

after the forwarding of the modified reachability signal, receiving, at the power output of the PDU, on the output cable, a return reachability signal comprising the identity of the power source, the identity of the power output of the power source, the identity of the PDU, the identity of the power output of the PDU and an identity of the load; and in response to receiving the return reachability signal, forwarding, from the power input of the PDU, on the input cable, a modified return reachability signal comprising the identity of the power source, the identity of the power output of the power source, the identity of the PDU, the identity of the power output of the PDU and the identity of the load.

In some implementations of the present technology, the method further comprises storing, in a database, a reference between the identity of the load, the identity of the power source, the identity of the power output of the power source, the identity of the PDU, and the identity of the power output of the PDU.

In some implementations of the present technology, each of the modified reachability signal, the return reachability signal and the modified return reachability signal further comprises an identity of the power input of the PDU.

In some implementations of the present technology, the method further comprises storing, in a database, a reference between the identity of the load, the identity of the power source, the identity of the power output of the power source, the identity of the PDU, the identity of the power output of the PDU and the identity of the power input of the PDU.

In some implementations of the present technology, the power output of the PDU is one of a plurality of power outputs of the PDU, the load is one of a plurality of loads, the output cable is one of a plurality of output cables, each one of the plurality of output cables respectively connecting one of the plurality of power outputs of the PDU to one of the plurality of loads, the method further comprising: broadcasting the modified reachability signal on the plurality of power outputs of the PDU; and for each given one of the plurality power outputs of the PDU: receiving a return reachability signal comprising an identity of a respective one of the plurality of loads, and forwarding, on the power input of the PDU, a modified return reachability signal comprising an identity of the given one of the plurality of power outputs of the PDU and the identity of the respective one of the plurality of loads.

In further aspects, various implementations of the present technology provide a power source, comprising:

a power output adapted to supply electric power to a plurality of loads via a cable connecting the power output to a power distribution unit (PDU), the power output being further adapted to send and receive signals to and from the PDU via the cable; and a processor operatively connected to a database and to the power output, the processor being adapted to:

cause the power output to send to the PDU, on the cable, a reachability signal comprising an identity of the power source and an identity of the power output of the power source, receive, from the power output, a plurality of return reachability signals, each return reachability signal comprising the identity of the power source, the identity of the power output of the power source, an identity of the PDU, an identity of a respective power output of the PDU, and an identity of a respective load, and cause the database to store, for each return reachability signal, a respective reference between the identity of the power source, the identity of the power output of the power source, the identity of the PDU, the identity of the respective power output of the PDU, and the identity of the respective load.

In some implementations of the present technology, each return reachability signal further comprises an identity of a power input of the PDU; and the reference stored in the database for each return reachability signal further comprises the identity of the power input of the PDU In some implementations of the present technology, the power output is one of a plurality of power outputs, the PDU is one of a plurality of PDUs, the cable is one of a plurality of cables, each one of the plurality of cables respectively connecting one of the plurality of power outputs to a respective one of the plurality of PDUs, the processor being further adapted to: cause sending a reachability signal on each cable connecting a respective one of the plurality of power outputs to a respective one of the plurality of PDUs, each reachability signal comprising the identity of the power source and an identity of the respective one of the plurality of power outputs of the power source; receive, from a given one of the plurality of power outputs, a plurality of additional return reachability signals, each return reachability signal comprising the identity of the power source, the identity of the given one of the plurality of power outputs of the power source, an identity of a given one of the plurality of PDUs that is respective to the given one of the plurality of power outputs of the power source, and an identity of a power output of the given one of the plurality of PDUs, and an identity of a given one of the plurality of loads, and cause the database to store, for each return reachability signal, a reference between the identity of the power source, the identity of the given one of the plurality of power outputs, the identity of the given one of the plurality of PDUs, the identity of the power output of the given one of the plurality of PDUs, and the identity of the given one of the plurality of loads.

In some implementations of the present technology, each return reachability signal further comprises an identity of a power input of the given one of the plurality of PDUs; and the reference stored in the database for each return reachability signal further comprises the identity of the power input of the given one of the plurality of PDUs.

In some implementations of the present technology, the power source is an uninterruptible power supply.

In other aspects, various implementations of the present technology provide a power distribution unit (PDU), comprising:

a power input adapted to receive electric power from a power source via an input cable and to send and receive signals to and from the power source via the input cable;

a power output adapted to supply electric power to a load via an output cable and to send and receive signals to and from the load via the output cable; and a processor operatively connected to the power input and to the power output, the processor being adapted to:

receive, from the power input, a reachability signal comprising an identity of the power source and an identity of a power output of the power source, in response to receiving the reachability signal, cause the power output to forward a modified reachability signal to the load, the modified reachability signal comprising the identity of the power source, the identity of the power output of the power source, an identity of the PDU, an identity of the power output of the PDU, after the forwarding of the modified reachability signal, receive, from the power output, a return reachability signal comprising the identity of the power source, the identity of the power output of the power source, the identity of the PDU, the identity of the power output of the PDU and an identity of the load, and in response to receiving the return reachability signal, cause the power input to forward to the power source, on the input cable, a modified return reachability signal comprising the identity of the power source, the identity of the power output of the power source, the identity of the PDU, the identity of the power output of the PDU and the identity of the load.

In some implementations of the present technology, each of the modified reachability signal, the return reachability signal and the modified return reachability signal further comprises an identity of the power input of the PDU.

In some implementations of the present technology, the PDU further comprises a modem implementing a power line communication protocol and operatively connected to the processor, to the power input and to the power output of the PDU, the modem being adapted to generate the modified reachability signal and the modified return reachability signal and to interpret the reachability signal and the return reachability signal.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
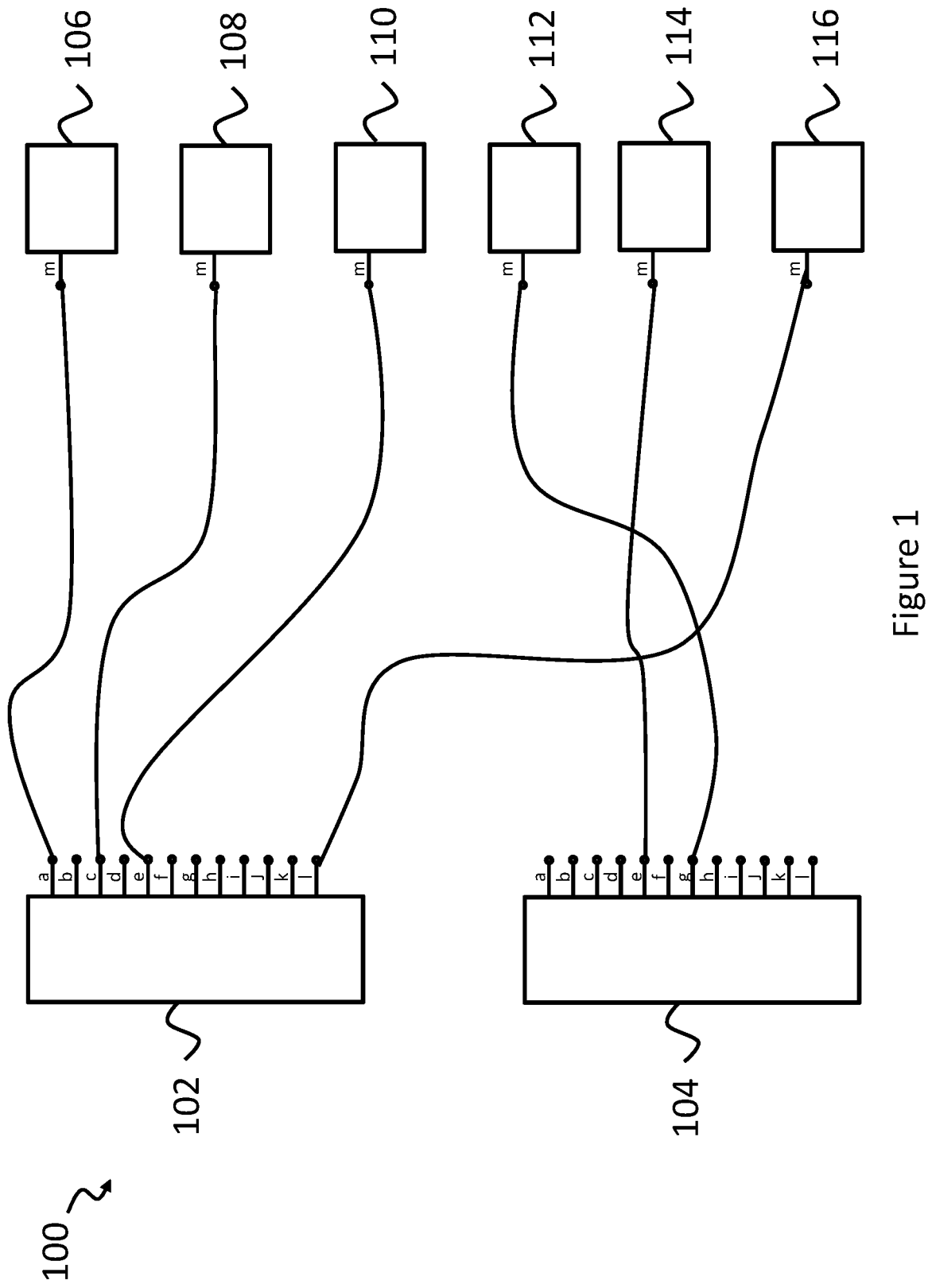
FIG. 1 illustrates a network in which power supplies provide electrical power to a number of loads.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes which may be substantially represented in computer-readable media and so executed by a computer or processor, whether or not such computer or processor is explicitly shown.

The functions of the various elements shown in the figures, including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

With these fundamentals in place, we will now consider some non-limiting examples to illustrate various implementations of aspects of the present technology.

FIG. 1 illustrates a network 100 in which power supplies 102 and 104 provide electrical power to a number of loads 106-116. Without limitation, the power supplies 102 and 104 may be uninterrupted power supplies (UPS) 102 and 104 and the loads 106-116 may be servers 106-116. Each UPS 102 and 104 includes 12 power outputs a-l; however the UPSs 102 and 104 could each have smaller or larger number of outputs. Each server 106-116 includes a power input m connected to one of the power outputs a-l of the UPS 102 or 104.

In the network 100, the power input 106$m$ of the server 106 is connected via an electrical power cable to the power output 102$a$ of the UPS 102. The power input 108$m$ of the server 108 is connected to the power output 102$c$ of the UPS 102. The power input 110$m$ of the server 110 is connected to the power output 102$e$ of the UPS 102. The power input 112$m$ of the server 112 is connected to the power output 104$g$ of the UPS 104. The power input 114$m$ of the server 114 is connected to the power output 104$e$ of the UPS 104. The power input 116$m$ of the server 106 is connected to the power output 102$l$ of the UPS 102.

The network 100 only contains six (6) distinct servers 106-116 and keeping track of the connections between these servers and the UPSs 102 and 104 should be a simple task. In a real-life implementation, a UPS may be capable of providing, for example, 500 KW of electric power to servers that each consumes 100 watts. A single UPS may therefore be able to power 5000 servers. A large data center may include many more servers that are fed by a larger number of UPSs. New servers and UPSs may be added on a continuous basis; in some cases new servers may be added on a daily basis. Failed devices may need to be replaced from time to time. Cabling installation errors may occur, cables may be accidentally disconnected, and some cables may fail.

In the network 100, two (2) of the servers 106-116 may be redundant, one of the two (2) servers being able to execute, as a backup, the tasks of the other server in case of a server failure. One possible cause of a server failure is the loss of electrical power. Considering for example the case where the servers 108 and 114 are redundant, the server 108 is powered by the UPS 102 and the server 114 is powered by the UPS 104. The loss of one UPS, for example the UPS 102, will not cause the loss of power at the server 114, which can continue receiving power from the UPS 104 and therefore continue executing the tasks of the server 108. However, if the servers 106 and 108 are designated as redundant, the loss of the UPS 102 will cause both servers 106 and 108 to fail, without any backup. Without proper referencing of the cable connections between the power sources and the loads, it may be difficult to evaluate whether power supply redundancy between loads is correctly configured.

Figure 2:
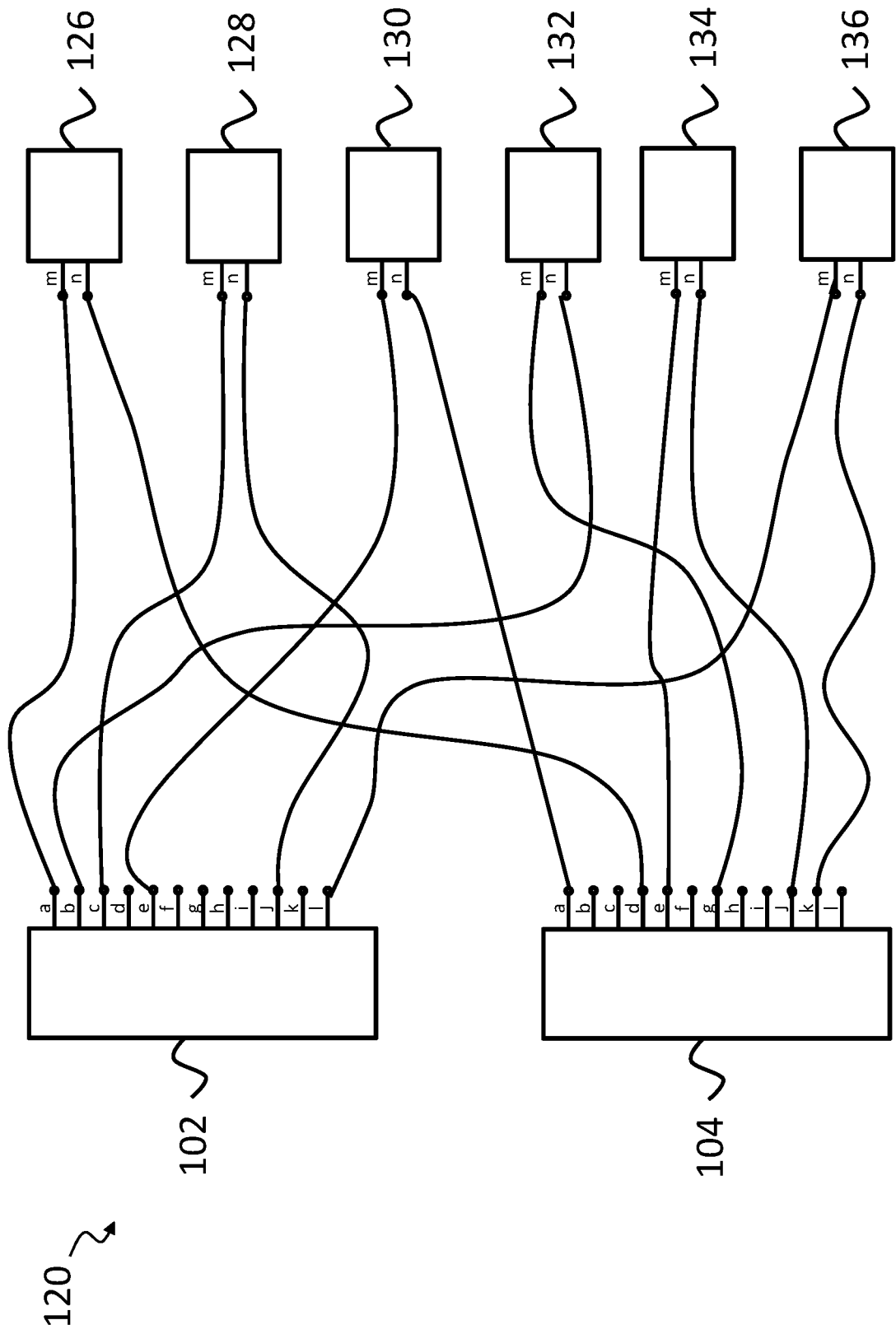
FIG. 2 illustrates another network in which power supplies provide electrical power to a number of loads.

FIG. 2 illustrates a network 120 in which the UPSs 102 and 104 provide electrical power to a number of servers 126-136. Each server 126-136 includes dual (redundant) power inputs m and n connected to one of the power outputs a-l of the UPSs 102 and 104. Because the power inputs m and n of each server is independent, each of these power inputs in fact constitutes a distinct load for the UPSs 102 and 104. In the network 120, the power input 126$m$ of the server 126 is connected via an electrical power cable to the power output 102$a$ of the UPS 102 and the power input 126$n$ is connected to the power output 104$d$ of the UPS 104. The power input 128$m$ of the server 128 is connected to the power output 102$c$ of the UPS 102 and the power input 128$n$ is connected to the power output 102$j$ of the UPS 102. The power input 130$m$ of the server 130 is connected to the power output 102$e$ of the UPS 102 and the power input 130$n$ is connected to the power output 104$a$ of the UPS 104. The power input 132$m$ of the server 132 is connected to the power output 104$g$ of the UPS 104 and the power input 132$n$ is connected to the power output 102$b$ of the UPS 102. The power input 134$m$ of the server 134 is connected to the power output 104$e$ of the UPS 104 and the power input 134$n$ is connected to the power output 104$j$ of the UPS 104. The power input 136$m$ of the server 106 is connected to the power output 102$l$ of the UPS 102 and the power input 136$n$ is connected to the power output 104$k$ of the UPS 104.

Comparing the configurations of networks 100 and 120, if the servers 126 and 128 are designated as redundant, the loss of the UPS 102 will cause both power inputs 128$m$ and 128$n$ of the server 128 to lose power. The input 126$m$ of the server 126 will also lose power, but the server 126 will still receive power from the UPS 104 via its power input 126$n$. However, in some implementations were the sole redundancy in the power delivery to the servers 126-136 is at the level of their dual power inputs, the failure of the UPS 102 will cause a failure of the server 128 while a failure of the UPS 104 will cause a failure of the server 134.

Figure 3:
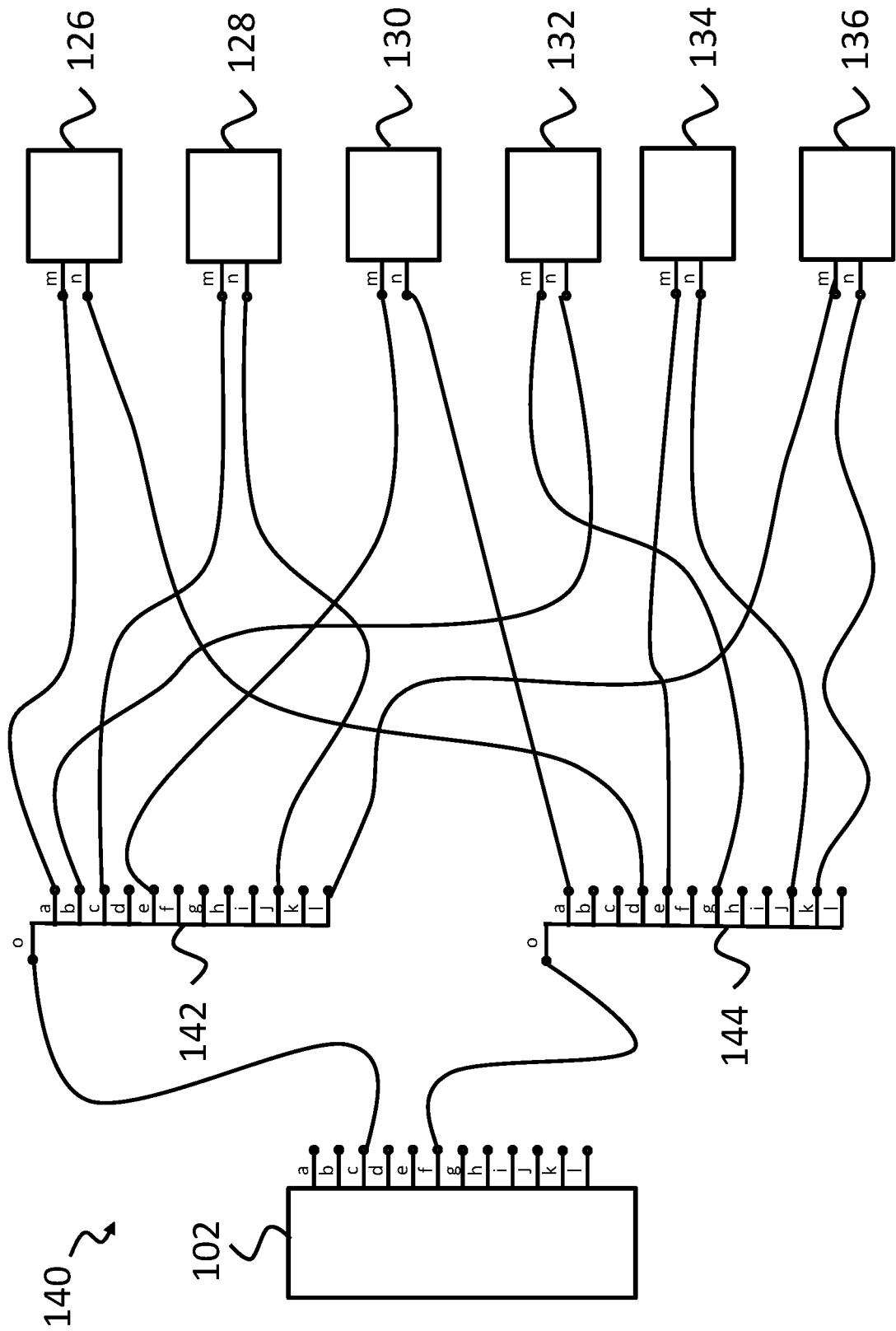
FIG. 3 illustrates yet another network in which a power supply provides electrical power to a number of servers via a pair of intermediate power supplies called power distribution units (PDU)

FIG. 3 illustrates a network 140 in which the UPS 102 provides electrical power to a number of servers 126-136 via a pair of intermediate power supplies called power distribution units (PDU) 142 and 144. The PDU 142 receives electrical power at its power input 142$o$ from the power output 102$c$ of the UPS 102 and the PDU 144$o$ receives electrical power at its power input 144$o$ from the power output 102$f$ of the UPS 102.

The dual power inputs m and n of the servers 126-136 are connected to one of the power outputs a-l of the PDUs 142 and 144. In the network 140, the power input 126m of the server 126 is connected via an electrical power cable to the power output 142a of the PDU 142 and the power input 126n is connected to the power output 144d of the PDU 144. The power input 128m of the server 128 is connected to the power output 142c of the PDU 142 and the power input 128n is connected to the power output 142j of the PDU 142. The power input 130m of the server 130 is connected to the power output 142e of the PDU 142 and the power input 130n is connected to the power output 144a of the PDU 144. The power input 132m of the server 132 is connected to the power output 144g of the PDU 144 and the power input 132n is connected to the power output 142b of the PDU 142. The power input 134m of the server 134 is connected to the power output 144e of the PDU 144 and the power input 134n is connected to the power output 144j of the PDU 144. The power input 136m of the server 136 is connected to the power output 142l of the PDU 142 and the power input 136n is connected to the power output 144k of the PDU 144. In the particular example of the network 140, redundancy considerations are equivalent to those of the network 120, in which the loss of one of the PDUs 142 or 144 in the network 140 has the same or equivalent effect as the loss of the UPS 102 or 104 in the network 120. The network 140 does not have redundant power supply for the PDUs 142 and 144 given that they are both connected to the same UPS 102. However, in a real-life implementation, the network 140 may comprise a plurality of UPSs and a plurality of PDUs connected to distinct UPSs and, as a result, server redundancy may be provided to prevent total loss of a service in case of failure of one of the PDUs or of one of the UPSs.

In an implementation, the identity (ID) of a power input or of a power output of a node (a UPS, a PDU, or a server) may contain, as a prefix, an ID of that node, a suffix designating the particular power input or power output. In another implementation, the ID of a node may not be determinable from the ID of the power input or power output. Consequently, in the example of FIG. 3, the UPS 102 as well as the PDU 142 and 144 may be unaware of the IDs of the servers 126-128 and only be cognizant of the IDs of the power inputs at these servers. Equivalently, the UPS 102 may be unaware of the IDs of the PDUs 142 and 144 and only be cognizant of the IDs of the power inputs and power outputs of theses PDUs. The present disclosure is not limited by the encoding of the IDs of the various nodes and of their power inputs and power.

Table I summarizes all connections established, via cables, between the UPS 104, the PDUs 142 and 144, and the power inputs of the servers 126-136 of the network 140. Some of the columns of Table I may be present in some implementations and not in other implementations, depending for example on the encoding of the IDs of the various nodes and of their power inputs and power. The ordering of rows in Table I is for illustration purposes and does not limit the present disclosure.

TABLE I

| Power Source (UPS) | Power Output | Intermediate Power Distribution (PDU) | Intermediate Input | Intermediate Output | Server | Load (Server Power Input) |
|---|---|---|---|---|---|---|
| 102 | 102c | 142 | 142o | 142a | 126 | 126m |
| 102 | 102c | 142 | 142o | 142b | 132 | 132n |
| 102 | 102c | 142 | 142o | 142c | 128 | 128m |
| 102 | 102c | 142 | 142o | 142e | 130 | 130m |

TABLE I-continued

| Power Source (UPS) | Power Output | Intermediate Power Distribution (PDU) | Intermediate Input | Intermediate Output | Server | Load (Server Power Input) |
|---|---|---|---|---|---|---|
| 102 | 102c | 142 | 142o | 142j | 128 | 128n |
| 102 | 102c | 142 | 142o | 142l | 136 | 136m |
| 102 | 102c | 144 | 144o | 144a | 130 | 130n |
| 102 | 102c | 144 | 144o | 144d | 126 | 126n |
| 102 | 102c | 144 | 144o | 144e | 134 | 134m |
| 102 | 102c | 144 | 144o | 144g | 132 | 132m |
| 102 | 102c | 144 | 144o | 144j | 134 | 134n |
| 102 | 102c | 144 | 144o | 144k | 136 | 136n |

It will be recognized that, in a large server network, Table I would include a much larger number of entries. The examples of FIGS. 1, 2 and 3 as well as Table I highlight some of the complex problems related to cabling in large networks, for example and without limitation in large server networks that may contain several thousands of servers. Whether or not power supply redundancy is desired, there is a need to facilitate referencing of power sources to loads in networks comprising large numbers of cables.

Figure 4:
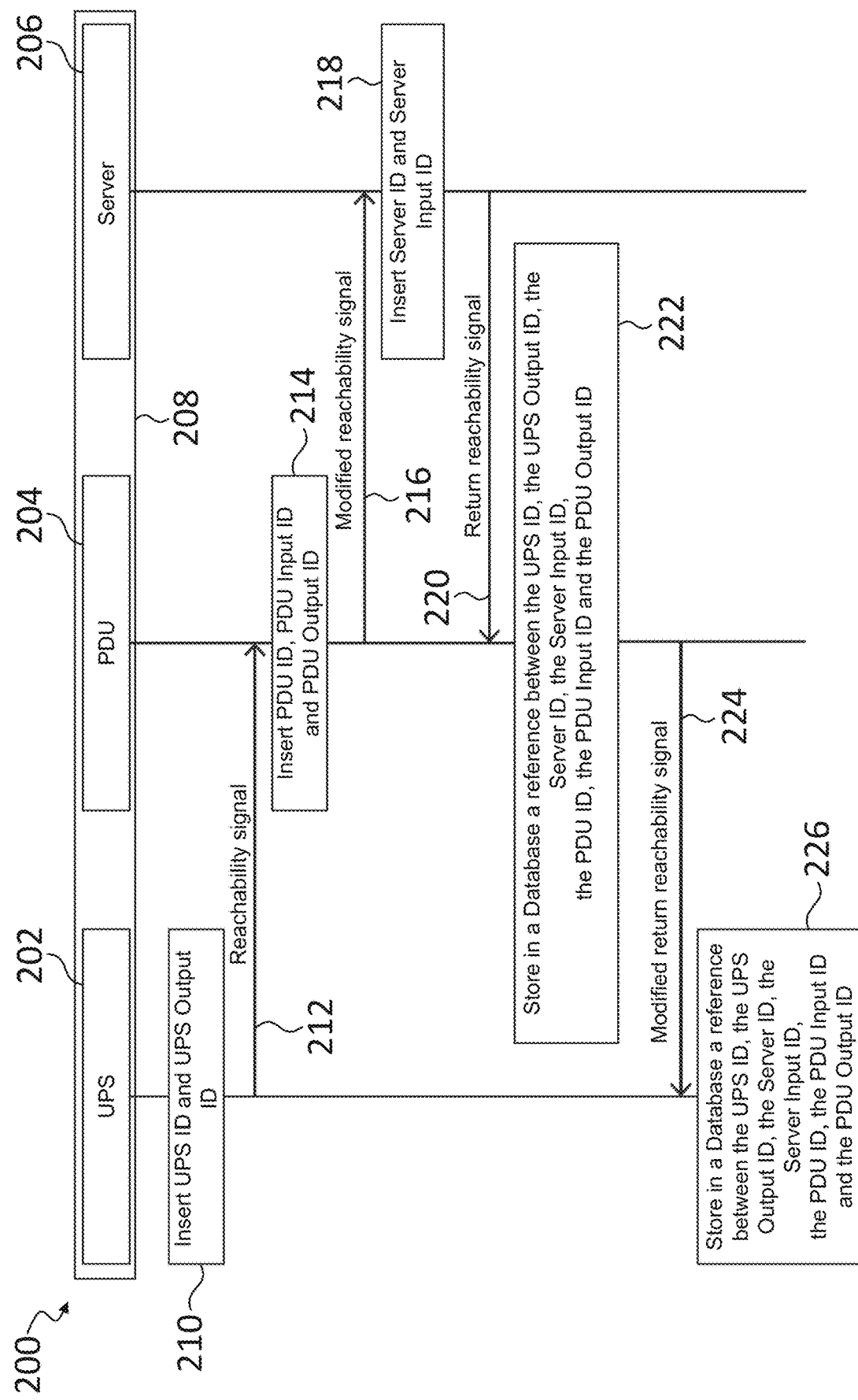
FIG. 4 is a sequence diagram showing an exchange of return reachability signals in accordance with an embodiment of the present technology.

The information as contained in Table I and extended in a very large network can be automatically stored in a database using one or more implementations of the present technology. For example, FIG. 4 is a sequence diagram showing an exchange of return reachability signals in accordance with an embodiment of the present technology. On FIG. 4, a sequence 200 for identifying a connection path between a power source and a load comprises a plurality of operations that may be executed in variable order, some of the operations possibly being executed concurrently, some of the operations being optional. The sequence 200 shows operations that take place in a power source, for example a UPS 202, a PDU 204 and a load, for example a server 206. The UPS 202, the PDU 204 and the server 206 are part of a network 208. It will be understood that the network 208 may include a plurality of UPSs, a large number of PDUs and may include thousands or tens of thousands of servers. It will also be recognized that the network 208 may include other types of power sources that are not uninterruptible, and other types of loads that are not computer servers. The UPS 202 may include a plurality of power outputs connected to power inputs of a plurality of distinct PDUs of connected to a plurality of distinct servers. Each PDU may include a plurality of power outputs connected to a plurality of servers. Each server may include one or more power input for receiving power via one of more cables. It will further be understood that, in a variant of the network 208, the servers or other loads may be directly connected, for example via cables, to the power sources. The configuration of the network 208 as shown is thus for illustration purposes and does not limit the present disclosure.

At operation 210, the UPS 202 inserts its own ID and an ID of one of its power outputs in a reachability signal 212 sent on a cable connected to that power output of the UPS 202. The reachability signal 212 may for example be in the form of a so-called "ping" packet, using an echo request signal according to the internet control message protocol (ICMP). The reachability signal 212 is sent toward the server 206 and would reach the server 206 if the UPS 202 was directly connected to the server 206 via a single cable. If the UPS 202 includes a plurality of power outputs, the reachability signal 212 may be broadcasted via distinct cables from each of the power outputs towards a plurality of directly connected loads or, as in the case of the network 208, via cables connecting each of the plurality of power outputs of the UPS 202 to corresponding PDUs. In that case, each instance of the reachability signal 212 may include the ID of the UPS 202 and a distinct ID for the relevant power output.

As shown, the reachability signal 212 first reaches the PDU 204. At operation 214, the PDU 204 modifies the reachability signal 212 by adding its own ID, an ID of its power input having received the reachability signal 212, and an ID of one of its power outputs in a modified reachability signal 216 (for example another echo request signal) forwarded on a cable connected to that power output of the PDU 204. If the PDU 204 includes a plurality of power outputs, the modified reachability signal 216 may be broadcasted via distinct cables from each of the power outputs of the PDU 204 towards a plurality of corresponding loads, for example servers. In that case, each instance of the modified reachability signal 216 may include the ID of the PDU 204 and a distinct ID for the relevant power output of the PDU 204.

Having received the modified reachability signal on a power input, at operation 218, the server 206 inserts its own ID, an ID of that power input and the information elements included in the modified reachability signal 216 in a return reachability signal 220 (for example another ping packet in the form of an ICMP echo reply signal) sent on the same cable connected to its power input. The PDU 204 receives the return reachability signal 220 and optionally stores in a database, at operation 222, a reference between the following information elements contained in the return reachability signal:
  a. the ID of the UPS 202,
  b. the ID of the power output of the UPS 202,
  c. the ID of the PDU 204,
  d. the ID of the power input of the PDU 204,
  e. the ID of the power output of the PDU 204,
  f. the ID of the server 206, and
  g. the ID of the power input of the server 206.

The PDU 204 then forwards a modified return reachability signal 224 (for example another echo reply signal) to the UPS 202. In an implementation, the modified return reachability signal 224 may include the same contents as that of the return reachability signal 220.

If the PDU 204 has broadcasted the modified reachability signal 216 from a plurality of its power outputs, the PDU 204 may receive numerous instances of the return reachability signal 220 that each correspond to a distinct server or to a distinct power input of any number of servers. The PDU 204 performs the operation 222 and forwards, on each of its power inputs, a modified return reachability signal 224 for each instance of the return reachability signal 220.

At operation 226, the UPS 202 stores a reference between the following information elements in a database:
  a. the ID of the UPS 202,
  b. the ID of the power output of the UPS 202,
  c. the ID of the PDU 204,
  d. the ID of the power input of the PDU 204,
  e. the ID of the power output of the PDU 204,
  f. the ID of the server 206, and
  g. the ID of the power input of the server 206.

If the UPS 202 has broadcasted the reachability signal 212 from a plurality of its power outputs or if the PDU 204 has broadcasted the modified reachability signal 216 from a plurality of its own power outputs, the UPS 202 may receive numerous instances of the modified return reachability signal 224 that each correspond to a distinct server or to a distinct power input of any number of servers. The UPS 202 performs the operation 226 for each instance of the modified return reachability signal 224.

Many variations of the sequence 200 may be contemplated. In a non-limiting example, a database may be integrated within the UPS 202, in which case there may be no need to store the ID of the UPS 202 in that database. The UPS 202 and the PDU 204 may be communicatively coupled with the same external database. In another non-limiting example, the ID of the power input of the PDU 204 may not be included in the modified reachability signal 216 because it may suffice to include it in the modified return reachability signal 224. In yet another non-limiting example, the reachability signal 212 may omit the ID of the UPS 202 and the ID of the power output of the UPS 202 when it is known that this power output of the UPS 202 is connected to the power input of the PDU 204 via one and only one cable. The provided examples show including all available ID information in each of the signals 212, 216, 220 and 224, but the skilled reader will be able to implement the sequence 200 without including some of these IDs in some of the signals 212, 216, 220 or 224.

It will be appreciated that the reachability signal 212, modified reachability signal 216, return reachability signal 220 and modified return reachability signal 224 may be exchanged between the various elements of the network 200 whether electrical power is applied by the UPS 202 to the PDU 204 and to the server 206, as long as these elements are connected via cables. However, in an embodiment, the echo request and echo reply signals 212, 216, 220 and 224 may be implemented over a power line communication (PLC) protocol. According to this protocol, signals such as the signals 212, 216, 220 and 224 can be transported on a modulated carrier signal added to the actual power feed.

Figure 5:
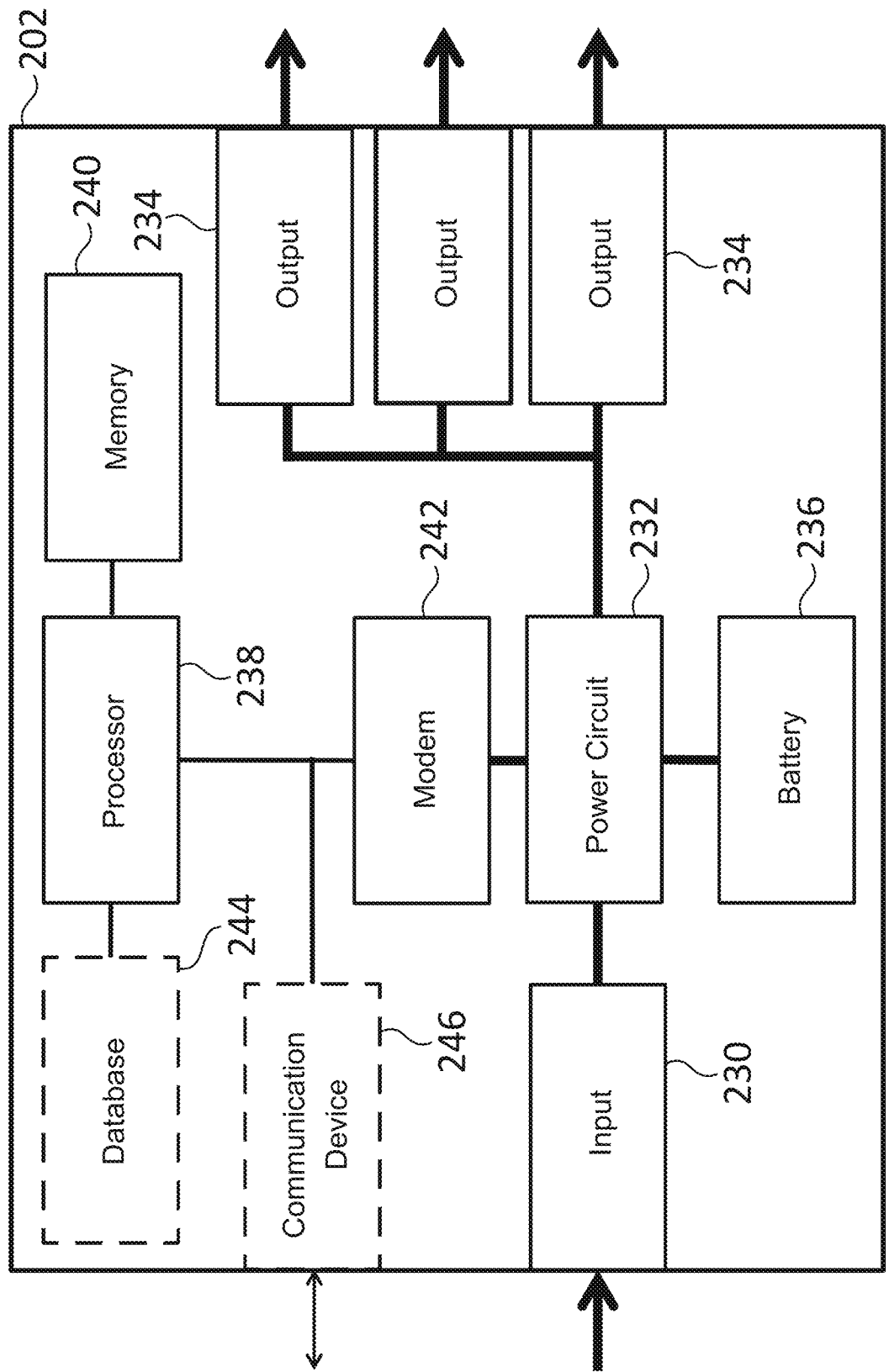
FIG. 5 is a block diagram of a power supply in accordance with an embodiment of the present technology.

FIG. 5 is a block diagram of a power supply in accordance with an embodiment of the present technology. The UPS 202 of FIG. 4 is reproduced on FIG. 5. In the shown embodiment, the UPS 202 includes a power input 230 adapted to receive electrical power from a grid. Electrical power may for example be supplied to the power input 230 by the grid at 110 volts or 220 volts, at 50 Hz or 60 Hz. The power input 230 is connected to a power circuit 232 that may include various electronic controls for the UPS 202. A number of power outputs 234 receive power from the power circuit 232. Respective cables (not shown) may be connected to each of the power outputs 234 and connect the UPS 202 to a load or to a PDU. The power circuit 232 arranges to recharge a battery 236 when power is available at the power input 230. The power circuit 232 retrieves power from the battery 236 in case of a loss of grid power in order to keep the power outputs 234 energized at least for a period of time. Other details of the power circuit 232 are not relevant to the present disclosure and are not discussed herein.

The UPS 202 further includes a processor 238 connected to a memory 240 that may store configuration information for the UPS 202. The memory 240 may also store non-transitory executable code that, when executed by the processor 238, cause the UPS 202 to implement the various functions of the UPS 202 described in the foregoing description of FIG. 4. The processor 238 obtains information about connections of the power input 230 and of the power outputs 234 via a modem 242, which may for example be a power line communication (PLC) modem. The UPS 202 may include a database 244 in which the processor 238 stores information about connections of the power input 230 and of the power outputs 234. Alternatively, instead of the database 244, the UPS 202 may include a communication device 246, in which case the processor 238 may cause the communication device 246 to forward information about connections of the power input 230 and of the power outputs 234 to a communicatively coupled remote database (not shown).

On FIG. 5, thick lines connecting the various components of the UPS 202 reveal electrical power lines, on which signalling may also be present. Thin lines connecting other components of the UPS 202 designate signalling paths.

In the UPS 202, each of the power outputs 234 is adapted to supply electric power via a respective cable (not shown) connected thereto and to send and receive signals via the cable. The processor 238 is operatively connected, either to the database 244 or to a remote database (not shown) via the communication device 246. The processor 238 is also operatively connected to the power outputs 234, via the modem 242 and the power circuit 232. The processor 238 may cause any one of the power outputs 234 to send a reachability signal on the cable on which it is connected. The processor 238 then receives, from the power output 234, a return reachability signal comprising an ID of a load. The processor 238 causes the database to store a reference between an ID of the power output 234 and the ID of the load. The ID of the power output 234 may for example be part of configuration information stored in the memory 240.

In an embodiment, the processor 238 may cause broadcasting of the reachability signal on each of the power outputs 234, following which one or more return reachability signals are received on each of the power outputs 234. The processor 238 causes the database to store a reference between an ID of each power output 234 having received a return reachability signal and an ID of a load included in that return reachability signal.

When a given power output 234 is connected to a PDU, the return reachability signal may include an ID of the PDU as well as IDs of a power input and of a power output of the PDU. The processor 238 adds these IDs in the reference to be stored in the database. Also in that case, the given power output 234 may receive a plurality of return reachability signals from the PDU, each return reachability signal comprising an ID of a load. The processor 238 causes the database to store a reference between an ID of the power output 234, the ID of the PDU, the ID of the power input of the PDU, the ID of the power output of the PDU, and the ID of the load.

Without limitation, the reachability signal and the return reachability signal may respectively be an ICMP echo request signal and an ICMP echo reply signal. Also without limitation, these signals may be transported over the PLC protocol. The modem 242 may implement the PLC protocol, generate the reachability signal, and interpret the return reachability signal.

Figure 6:
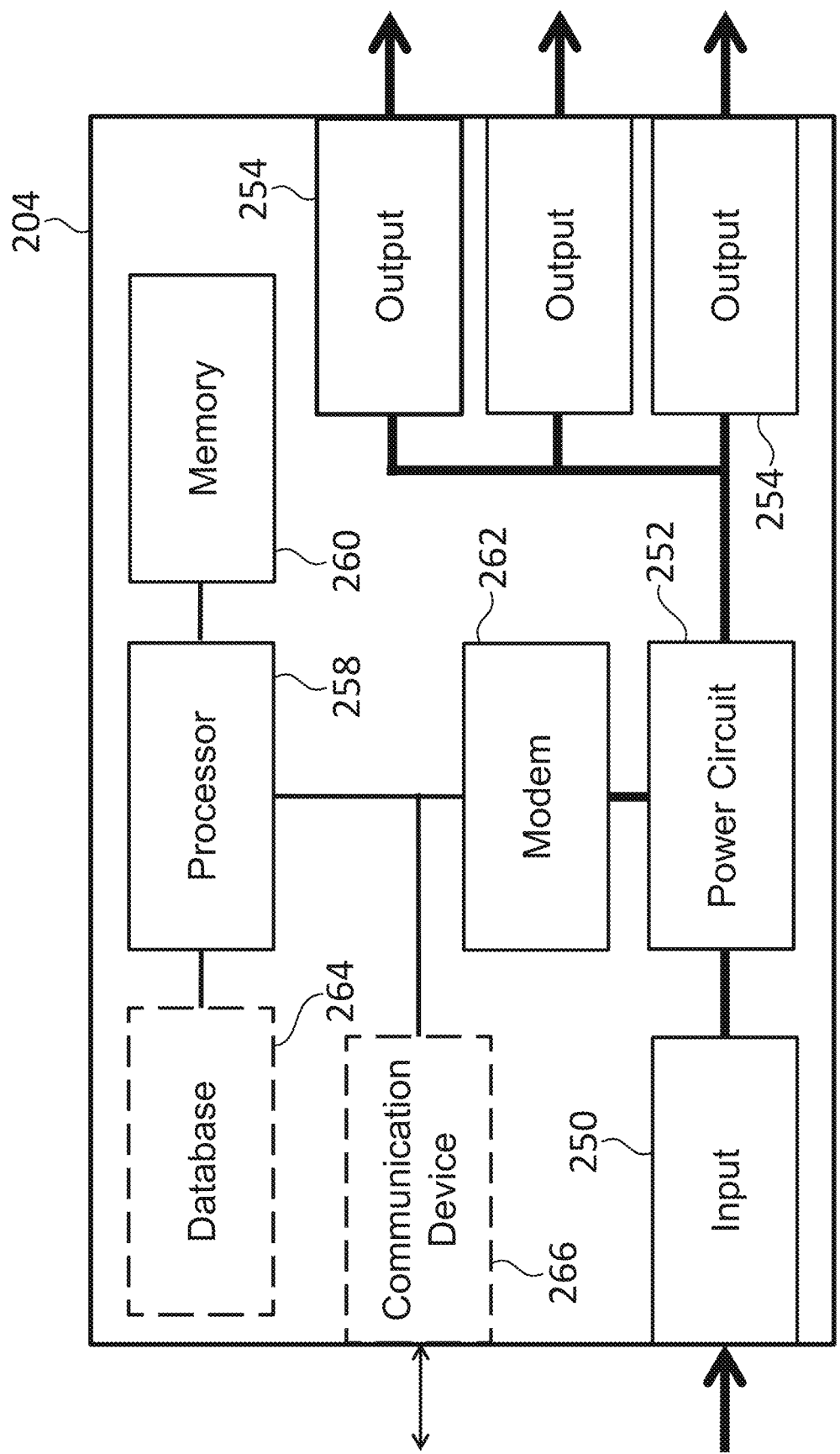
FIG. 6 is a block diagram of a power distribution unit (PDU) in accordance with an embodiment of the present technology.

FIG. 6 is a block diagram of a power distribution unit (PDU) in accordance with an embodiment of the present technology. The PDU 204 of FIG. 4 is reproduced with more details on FIG. 6. In the shown embodiment, the PDU 204 includes a power input 250 adapted to receive electrical power from a power source such as for example the UPS 202. Electrical power may for example be supplied to the power input 250 by the UPS 202 at 110 volts or 220 volts, at 50 Hz or 60 Hz. The power input 250 is connected to a power circuit 252 that may include various electronic controls for the PDU 204. A number of power outputs 254 receive power from the power circuit 252. Other details of the power circuit 252 are not relevant to the present disclosure and are not discussed herein.

The PDU 204 further includes a processor 258 connected to a memory 260 that may store configuration information for the PDU 204. The memory 260 may also store non-transitory executable code that, when executed by the processor 258, cause the PDU 204 to implement the various functions of the PDU 204 described in the foregoing description of FIG. 4. The processor 258 obtains information about connections of the power input 250 and of the power outputs 254 via a modem 262, which may for example be a PLC modem. The PDU 204 may include a database 264 in which the processor 258 stores information about connections of the power input 250 and of the power outputs 254. Alternatively, instead of the database 264, the PDU 204 may include a communication device 266, in which case the processor 258 may cause the communication device 266 to forward information about connections of the power input 250 and of the power outputs 254 to a communicatively coupled remote database (not shown). However, in at least one embodiment, the processor 258 may not store any information in a database, this function being in such a case realized in the UPS 202.

On FIG. 6, thick lines connecting the various components of the PDU 204 reveal electrical power lines, on which signalling may also be present. Thin lines connecting other components of the PDU 204 designate signalling paths.

In the PDU 204, the power input 250 is adapted to receive electric power via a cable (not shown) connected thereto and to send and receive signals via the cable. Each of the power outputs 254 is adapted to supply electric power via a respective cable (not shown) connected thereto and to send and receive signals via the cable. The processor 258 may optionally be connected to a database. In a variant, the optional database is the database 264. In another variant, the optional database is a remote database (not shown) connectable to the communication device 266. The processor 258 is operatively connected to the power input 250 and to the power outputs 254, via the modem 262 and the power circuit 252. The processor 258 may receive a reachability signal from the power input 250 and cause any one of the power outputs 254 to forward a modified reachability signal on the cable on which it is connected. The processor 258 then receives, from one or more the power output 254, one or more return reachability signals that each comprises an ID of a load. The processor 258 causes the power input 250 to forward, for each received return reachability signal, a modified return reachability signal comprising the ID of the load on the cable on which it is connected.

In an embodiment, the reachability signal further comprises an ID of a power source connected by cable to the power input 250 and an ID of a power output of the power source, in which case the modified reachability signal further comprises the ID of the power source, the ID of the power output of the power source, an ID of the PDU 204 and an ID of the power output 254. The return reachability signal may further comprises the ID of the power source, the ID of the power output of the power source, the ID of the PDU 204 and the ID of the power output 254, in which case the modified return reachability signal further comprises the ID of the power source, the ID of the power output of the power source, the ID of the PDU 204, the ID of the power output 254 and an ID of the power input 250. IDs of the PDU 204, of the power input 250 and of the power output 254 may for example be part of configuration information stored in the memory 260.

The processor 258 may cause each of the power outputs 254 to forward the modified reachability signal, in broadcast fashion, on respective cables. The processor 258 may then receive, from each given one of the power outputs 254, a return reachability signal comprising an ID of a respective load. The processor 258 then causes the power input 250 to forward a modified return reachability signal comprising an ID of the given one of the power outputs of the PDU 254 and the ID of the respective load.

The modem 262 may implement the PLC protocol, generate the modified reachability signal and the modified return reachability signal and, interpret the reachability signal and the return reachability signal.

As in the case of the UPS 202, and without limitation, the reachability signal and the return reachability signal may respectively be an ICMP echo request signal and an ICMP echo reply signal. Also without limitation, these signals may be transported over the PLC protocol.

FIGS. 5 and 6 do not highlight some important dissimilarities between the UPS 202 and the PDU 204. A typical PDU 204 may be able to deliver for example 1000 watts to a number of connected loads while a typical UPS 202 may be able to supply up to 500 KW of power. In particular, their respective power circuits 232 and 252 may incorporate different power control and electrical protection features. Their respective processors 238 and 258 may implement other functions not related to the present disclosure. They each may include different numbers of power outputs 234 or 254.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

The systems and methods for identifying a connection path between a power source and a load implemented in accordance with some non-limiting embodiments of the present technology can be represented as follows, presented in numbered clauses.

CLAUSES

[Clause 1] A method for identifying a connection path between a power source and a load, comprising:
sending, on a cable connecting a power output of the power source toward the load, a reachability signal;
receiving, at the power output of the power source, a return reachability signal comprising an identity of the load; and
storing, in a database, a reference between an identity of the power output of the power source and the identity of the load.

[Clause 2] The method of clause 1, wherein the reachability signal comprises an identity of the power source and the identity of the power output of the power source.

[Clause 3] The method of clause 1 or 2, wherein the power output of the power source is one of a plurality of power outputs of the power source, the load is one of a plurality of loads, the cable is one of a plurality of cables, each one of the plurality of cables respectively connecting one of the plurality of power outputs of the power source toward one of the plurality of loads, the method further comprising:
broadcasting the reachability signal on the plurality of power outputs of the power source; and
for each given one of the plurality power outputs of the power source:
receiving a return reachability signal comprising an identity of a respective one of the plurality of loads, and
storing in the database a reference between an identity of the given one of the plurality of power outputs of the power source and the identity of the respective one of the plurality of loads.

[Clause 4] The method of clause 1 or 2, wherein:
the cable connects the power source toward a power distribution unit (PDU);
the return reachability signal further comprises an identity of the PDU; and
storing the reference between the identity of the power output of the power source and the identity of the load further comprises storing the identity of the PDU.

[Clause 5] The method of clause 4, wherein:
the identity of the PDU further comprises an identity of a power input of the PDU and an identity of a power output of the PDU;
storing the identity of the PDU further comprises storing the identity of the power input of the PDU and the identity of the power output of the PDU.

[Clause 6] The method of clause 4 or 5, further comprising:
receiving, at the power output of the power source, one or more additional return reachability signals, each additional return reachability signal comprising an identity of an additional load and the identity of the PDU; and
for each of the one or more additional return reachability signals received at the power output of the power source, storing in the database a reference between the identity of the power output of the power source, the identity of the PDU and the identity of the additional load.

[Clause 7] The method of clause 4 or 5, wherein the power output of the power source is one of a plurality of power outputs of the power source, the load is one of a plurality of loads, the PDU is one of a plurality of PDUs, the cable is one of a plurality of cables, each one of the plurality of cables respectively connecting one of the plurality of power outputs of the power source toward one of the plurality of PDUs, the method further comprising:
broadcasting the reachability signal on the plurality of power outputs of the power source;
receiving a plurality of additional return reachability signals, each additional return reachability signal:
being received at a given one of the plurality of power outputs of the power source,
comprising an identity of a respective one of the plurality of PDUs, and
comprising an identity of a given one of the plurality of loads; and
for each of the plurality of additional return reachability signals, storing in the database a reference between:
an identity of the given one of the plurality of power outputs of the power source,
the identity of the respective one of the plurality of PDUs, and
the identity the given one of the plurality of loads.

[Clause 8] The method of any one of clauses 1 to 7, wherein the database is integrated in the power source.

[Clause 9] A method for identifying a connection path between a power source and a load, comprising:
receiving, on an input cable connecting a power input of a power distribution unit (PDU) toward the power source, a reachability signal;

forwarding, on an output cable connecting a power output of the PDU toward the load, a modified reachability signal;

receiving, at the power output of the PDU, a return reachability signal comprising an identity of the load; and forwarding, on the power input of the PDU, a modified return reachability signal comprising the identity of the load.

[Clause 10] The method of clause 9, wherein:
the reachability signal further comprises an identity of the power source and an identity of a power output of the power source;
the modified reachability signal further comprises the identity of the power source, the identity of the power output of the power source, an identity of the PDU and an identity of the power output of the PDU;
the return reachability signal further comprises the identity of the power source, the identity of the power output of the power source, the identity of the PDU and the identity of the power output of the PDU; and
the modified return reachability signal further comprises the identity of the power source, the identity of the power output of the power source, the identity of the PDU, the identity of the power output of the PDU and an identity of the power input of the PDU.

[Clause 11] The method of clause 10, further comprising storing, in a database, a reference between the identity of the load, the identity of the power source, the identity of the power output of the power source, the identity of the PDU, the identity of the power output of the PDU and the identity of the power input of the PDU.

[Clause 12] The method of any one of clauses 9 to 11, wherein the power output of the PDU is one of a plurality of power outputs of the PDU, the load is one of a plurality of loads, the output cable is one of a plurality of output cables, each one of the plurality of output cables respectively connecting one of the plurality of power outputs of the PDU toward one of the plurality of loads, the method further comprising:
broadcasting the modified reachability signal on the plurality of power outputs of the PDU; and
for each given one of the plurality power outputs of the PDU:
receiving a return reachability signal comprising an identity of a respective one of the plurality of loads, and
forwarding, on the power input of the PDU, a modified return reachability signal comprising an identity of the given one of the plurality of power outputs of the PDU and the identity of the respective one of the plurality of loads.

[Clause 13] The method of any one of clauses 1 to 12, wherein the reachability signal is an echo request signal and the return reachability signal is an echo reply signal.

[Clause 14] The method of any one of clauses 1 to 13, wherein the reachability signal and the return reachability signal are implemented using a power line communication protocol.

[Clause 15] The method of any one of clauses 1 to 14, wherein the power source is an uninterruptible power supply.

[Clause 16] The method of any one of clauses 1 to 15, wherein the load is a server.

[Clause 17] The method of any one of clauses 1 to 15, wherein the load is a power input of a server having a plurality of independent power inputs.

[Clause 18] The method of any one of clauses 1 to 16, wherein:
the return reachability signal further comprises an identity of a power input of the load; and
storing the reference between the identity of the power output of the power source and the identity of the load further comprises storing the identity of the power input of the load.

[Clause 19] A power source, comprising:
a power output adapted to supply electric power via a cable and to send and receive signals via the cable; and
a processor operatively connected to a database and to the power output, the processor being adapted to:
cause the power output to send, on the cable, a reachability signal,
receive, from the power output, a return reachability signal comprising an identity of a load, and
cause the database to store a reference between an identity of the power output and the identity of the load.

[Clause 20] The power source of clause 19, wherein the power output is one of a plurality of power outputs, the load is one of a plurality of loads, the cable is one of a plurality of cables, each one of the plurality of cables respectively connecting one of the plurality of power outputs toward one of the plurality of loads, the processor being further adapted to:
cause broadcasting of the reachability signal on the plurality of power outputs; and
for each given one of the plurality power outputs:
receive, from the given one of the plurality of power outputs, a return reachability signal comprising an identity of a respective one of the plurality of loads, and
cause the database to store a reference between an identity of the given one of the plurality of power outputs and the identity of the respective one of the plurality of loads.

[Clause 21] The power source of clause 19, wherein:
the cable connects the power source toward a power distribution unit (PDU);
the return reachability signal further comprises an identity of the PDU; and
the processor is further adapted to cause the database to store the reference between the identity of the power output and the identity of the load with the identity of the PDU.

[Clause 22] The power source of clause 21, wherein the processor is further adapted to:
receive, from the power output, one or more additional return reachability signals, each additional return reachability signal comprising an identity of an additional load and the identity of the PDU; and
for each of the one or more additional return reachability signals received at the power output, cause the database to store a reference between the identity of the power output, the identity of the PDU and the identity of the additional load.

[Clause 23] The power source of clause 21, wherein the power output is one of a plurality
of power outputs, the load is one of a plurality of loads, the PDU is one of a plurality of PDUs, the cable is one of a plurality of cables, each one of the plurality of cables respectively connecting one of the plurality of power outputs toward one of the plurality of PDUs, the processor being further adapted to:
cause broadcasting of the reachability signal on the plurality of power outputs;

receive a plurality of additional return reachability signals, each additional return reachability signal:
being received at a given one of the plurality of power outputs,
comprising an identity of a respective one of the plurality of PDUs, and
comprising an identity of a given one of the plurality of loads; and
for each of the plurality of additional return reachability signals, cause the database to store a reference between:
an identity of the given one of the plurality of power outputs,
the identity of the respective one of the plurality of PDUs, and
the identity the given one of the plurality of loads.

[Clause 24] The power source of any one of clauses 19 to 23, wherein the database is integrated in the power source.

[Clause 25] The power source of any one of clauses 19 to 23, further comprising a communication device operatively connected to the processor and adapted to communicate with the database.

[Clause 26] The power source of any one of clauses 19 to 25, wherein the reachability signal is an echo request signal and the return reachability signal is an echo reply signal.

[Clause 27] The power source of any one of clauses 19 to 26, further comprising a modem implementing a power line communication protocol and operatively connected to the processor and to the power output, the modem being adapted to generate the reachability signal and to interpret the return reachability signal.

[Clause 28] The power source of any one of clauses 19 to 27, wherein the power source is an uninterruptible power supply.

[Clause 29] A power distribution unit (PDU), comprising:
a power input adapted to receive electric power via an input cable and to send and receive signals via the input cable;
a power output adapted to supply electric power via an output cable and to send and receive signals via the output cable; and
a processor operatively connected to the power input and to the power output, the processor being adapted to:
receive, from the power input, a reachability signal,
cause the power output to forward a modified reachability signal,
receive, from the power output, a return reachability signal comprising an identity of a load, and
cause the power input to forward a modified return reachability signal comprising the identity of the load.

[Clause 30] The PDU of clause 29, wherein:
the reachability signal further comprises an identity of a power source and an identity of a power output of the power source;
the modified reachability signal further comprises the identity of the power source, the identity of the power output of the power source, an identity of the PDU and an identity of the power output of the PDU;
the return reachability signal further comprises the identity of the power source, the identity of the power output of the power source, the identity of the PDU and the identity of the power output of the PDU; and
the modified return reachability signal further comprises the identity of the power source, the identity of the power output of the power source, the identity of the PDU, the identity of the power output of the PDU and an identity of the power input of the PDU.

[Clause 31] The PDU of clause 30, further comprising a database operatively connected to the processor, wherein the processor is further adapted to cause the database to store a reference between the identity of the load, the identity of the power source, the identity of the power output of the power source, the identity of the PDU, the identity of the power output of the PDU and the identity of the power input of the PDU.

[Clause 32] The PDU of clause 30, further comprising a communication device operatively connected to the processor and adapted to communicate with a database, the processor being further adapted to cause the communication device to forward to the database a reference between the identity of the load, the identity of the power source, the identity of the power output of the power source, the identity of the PDU, the identity of the power output of the PDU and the identity of the power input of the PDU.

[Clause 33] The PDU of any one of clauses 29 to 32, wherein the power output of the PDU is one of a plurality of power outputs of the PDU, the load is one of a plurality of loads, the output cable is one of a plurality of output cables, each one of the plurality of output cables respectively connecting one of the plurality of power outputs of the PDU toward one of the plurality of loads, the processor being further adapted to:
cause broadcasting of the modified reachability signal on the plurality of power outputs of the PDU; and
for each given one of the plurality of power outputs of the PDU:
receive, from the given one of the plurality of power outputs of the PDU, a return reachability signal comprising an identity of a respective one of the plurality of loads, and
cause the power input of the PDU to forward a modified return reachability signal comprising an identity of the given one of the plurality of power outputs of the PDU and the identity of the respective one of the plurality of loads.

[Clause 34] The PDU of any one of clauses 29 to 33, wherein the reachability signal and the modified reachability signal are echo request signals and the return reachability signal and modified return reachability signal are echo reply signals.

[Clause 35] The PDU of any one of clauses 29 to 34, further comprising a modem implementing a power line communication protocol and operatively connected to the processor, to the power input and to the power output of the PDU, the modem being adapted to generate the modified reachability signal and the modified return reachability signal and to interpret the reachability signal and the return reachability signal.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:
1. A method implemented in a power source for identifying connection paths between the power source and a plurality of loads, the power source having an identity, the power source also having a plurality of power outputs, each power output having a respective identity and being connected to a respective power distribution unit (PDU) via a respective cable, the method comprising:

for each given power output of the power source:
   sending, from the given power output of the power source, on the respective cable connecting the given power output of the power source to the respective PDU, a respective reachability signal;
   receiving, at the given power output of the power source, on the respective cable, a plurality of return reachability signals, each received return reachability signal comprising an identity of the respective PDU connected to the given power output of the power source, an identity of a respective power output of the respective PDU, and an identity of a respective load; and
   for each received return reachability signal, storing, in a database, a respective reference between the identity of the power source, the identity of the given power output of the power source having received the return reachability signal, the identity of the respective PDU, the identity of the respective power output of the respective PDU, and the identity of the respective load.

2. The method of claim 1, wherein:
each return reachability signal further comprises an identity of a power input of the respective load; and
the method further comprises storing the identity of the power input of the respective load in the respective reference.

3. The method of claim 1, wherein:
each return reachability signal further comprises an identity of a power input of the respective PDU; and
the reference stored in the database for each return reachability signal further comprises the identity of the power input of the respective PDU.

4. The method of claim 1, wherein:
the respective reachability signal comprises the identity of the power source and the identity of the respective power output of the power source; and
each received return reachability signal further comprises the identity of the power source and the identity of the respective power output of the power source.

5. A method implemented in a power distribution unit (PDU) for identifying a connection path between a power source and a load, the PDU having an identity and, the PDU also having a power output having an identity, the method comprising:
   receiving, at a power input of the PDU, on an input cable connecting the power input of the PDU to the power source, a reachability signal;
   in response to receiving the reachability signal, forwarding, from the power output of the PDU, on an output cable connecting the power output of the PDU to the load, a modified reachability signal;
   after the forwarding of the modified reachability signal, receiving, at the power output of the PDU, on the output cable, a return reachability signal comprising an identity of the load; and
   in response to receiving the return reachability signal, forwarding, from the power input of the PDU, on the input cable, a modified return reachability signal comprising the identity of the PDU, the identity of the power output of the PDU and the identity of the load.

6. The method of claim 5, wherein:
the reachability signal comprises an identity of the power source and an identity of a power output of the power source;
the modified reachability signal further comprises the identity of the power source, the identity of the power output of the power source, the identity of the PDU and the identity of the power output of the PDU;
the return reachability signal further comprises the identity of the power source, the identity of the power output of the power source, the identity of the PDU and the identity of the power output of the PDU; and
the modified return reachability signal further comprises the identity of the power source and the identity of the power output of the power source.

7. The method of claim 6, further comprising storing, in a database, a reference between the identity of the load, the identity of the power source, the identity of the power output of the power source, the identity of the PDU, and the identity of the power output of the PDU.

8. The method of claim 6, wherein each of the modified reachability signal, the return reachability signal and the modified return reachability signal further comprises an identity of the power input of the PDU.

9. The method of claim 8, further comprising storing, in a database, a reference between the identity of the load, the identity of the power source, the identity of the power output of the power source, the identity of the PDU, the identity of the power output of the PDU and the identity of the power input of the PDU.

10. The method of claim 5, wherein the power output of the PDU is one of a plurality of power outputs of the PDU, the load is one of a plurality of loads, the output cable is one of a plurality of output cables, each one of the plurality of output cables respectively connecting one of the plurality of power outputs of the PDU to one of the plurality of loads, the method further comprising:
   broadcasting the modified reachability signal on the plurality of power outputs of the PDU; and
   for each given one of the plurality of power outputs of the PDU:
      receiving a return reachability signal comprising an identity of a respective one of the plurality of loads, and
      forwarding, on the power input of the PDU, a modified return reachability signal comprising an identity of the given one of the plurality of power outputs of the PDU and the identity of the respective one of the plurality of loads.

11. A power source having an identity, the power source comprising:
   a plurality of power outputs, each given power output having an identity and being adapted to supply electric power to a plurality of loads via a respective cable connecting the given power output to a respective power distribution unit (PDU), each given power output being further adapted to send and receive signals to and from the respective PDU via the respective cable; and
   a processor operatively connected to a database and to each of the plurality of power outputs, the processor being adapted to:
      cause each given power output to send to the respective PDU, on the respective cable, a respective reachability signal,
      receive, from each given power output, a plurality of return reachability signals, each return reachability signal comprising an identity of the respective PDU, an identity of a respective power output of the respective PDU, and an identity of a respective load, and
      cause the database to store, for each return reachability signal, a respective reference between the identity of the power source, the identity of the given power output of the power source having received the return reachability signal, the identity of the respective PDU, the identity of the respective power output of the respective PDU, and the identity of the respective load.

12. The power source of claim 11, wherein:
each return reachability signal further comprises an identity of a power input of the respective PDU; and
the reference stored in the database for each return reachability signal further comprises the identity of the power input of the respective PDU.

13. The power source of claim 11, wherein the power source is an uninterruptible power supply.

14. The power source of claim 11, wherein:
the respective reachability signal comprises the identity of the power source and the identity of the respective power output of the power source; and
each received return reachability signal further comprises the identity of the power source and the identity of the respective power output of the power source.

15. A power distribution unit (PDU) having an identity, the PDU comprising:
a power input adapted to receive electric power from a power source via an input cable and to send and receive signals to and from the power source via the input cable;
a power output having an identity, the power output being adapted to supply electric power to a load via an output cable and to send and receive signals to and from the load via the output cable; and
a processor operatively connected to the power input and to the power output, the processor being adapted to:
receive, from the power input, a reachability signal,
in response to receiving the reachability signal, cause the power output to forward a modified reachability signal to the load,
after the forwarding of the modified reachability signal, receive, from the power output, a return reachability signal comprising an identity of the load, and
in response to receiving the return reachability signal, cause the power input to forward to the power source, on the input cable, a modified return reachability signal comprising the identity of the PDU, the identity of the power output of the PDU and the identity of the load.

16. The PDU of claim 15, wherein each of the modified reachability signal, the return reachability signal and the modified return reachability signal further comprises an identity of the power input of the PDU.

17. The PDU of claim 15, further comprising a modem implementing a power line communication protocol and operatively connected to the processor, to the power input and to the power output of the PDU, the modem being adapted to generate the modified reachability signal and the modified return reachability signal and to interpret the reachability signal and the return reachability signal.

18. The PDU of claim 15, wherein:
the reachability signal comprises an identity of the power source and an identity of a power output of the power source;
the modified reachability signal further comprises the identity of the power source, the identity of the power output of the power source, the identity of the PDU and the identity of the power output of the PDU;
the return reachability signal further comprises the identity of the power source, the identity of the power output of the power source, the identity of the PDU and the identity of the power output of the PDU; and
the modified return reachability signal further comprises the identity of the power source and the identity of the power output of the power source.

* * * * *